United States Patent [19]

Sekihara et al.

[11] Patent Number: 4,472,683
[45] Date of Patent: Sep. 18, 1984

[54] IMAGING APPARATUS USING NUCLEAR MAGNETIC RESONANCE

[75] Inventors: Kensuke Sekihara; Etsuji Yamamoto, both of Hachioji; Hideki Kohno, Tokyo; Shinji Yamamoto, Hachioji, all of Japan

[73] Assignee: Hitachi, Ltd., Tokyo, Japan

[21] Appl. No.: 420,303

[22] Filed: Sep. 20, 1982

[30] Foreign Application Priority Data

Sep. 18, 1981 [JP] Japan ................................ 56-147432

[51] Int. Cl.$^3$ ............................................. G01R 33/08
[52] U.S. Cl. .................................. 324/309; 324/300; 324/307
[58] Field of Search ............... 324/300, 307, 309, 311, 324/310, 318

[56] References Cited

U.S. PATENT DOCUMENTS 4,124,813 11/1978 Mefed ................................ 324/310

*Primary Examiner*—Michael J. Tokar
*Attorney, Agent, or Firm*—Antonelli, Terry & Wands

[57] ABSTRACT

An imaging apparatus using nuclear magnetic resonance is disclosed in which both an image corresponding to the projection of a nuclear spin distribution in a to-be-inspected object on a two-dimensional plane and a display mark indicating a desired measuring position are displayed on a display face of a display device such as a CRT display, the display mark is freely moved on the display face to be set at a desired position on the display face, and magnetic field generating means for generating a static magnetic field, linear gradient field, or radio frequency magnetic field is controlled on the basis of the desired position of the display mark to obtain an image of that cross section of the object which is located at a position indicated by the display mark.

8 Claims, 8 Drawing Figures

IMAGING APPARATUS USING NUCLEAR MAGNETIC RESONANCE

BACKGROUND OF THE INVENTION

The present invention relates to an inspecting apparatus for nondestructively obtaining nuclear magnetic resonance (NMR) data such as density distribution or relaxation time distribution of nuclear spins in an object to be inspected, by utilizing nuclear magnetic resonance (NMR), and more particularly to an imaging apparatus using nuclear magnetic resonance which is provided with means for determining a measuring position in an object to be measured.

An X-ray computed tomograph (X-ray CT) and an ultrasonic imaging apparatus have hitherto been widely used to nondestructively inspect the internal structure of a human body or the like. In recent years, an attempt to make a similar inspection by utilizing nuclear magnetic resonance has been made with success, and it has become apparent that the inspection using nuclear magnetic resonance can obtain information which is not given by the X-ray CT and ultrasonic imaging apparatus.

In an imaging apparatus using nuclear magnetic resonance, information with respect to nuclear magnetic resonance such as density distribution or relaxation time distribution of nuclear spins in an object is nondestructively obtained from the outside of the object by utilizing the nuclear magnetic resonance phenomenon, and thus a cross section of a desired measuring target in the object is reconstructed and displayed in a manner similar to the X-ray CT.

In such an imaging apparatus, it is necessary to previously determine a measuring target in an object. For example, in the X-ray CT, prior to a detailed inspection (namely, a main inspection), an X-ray image similar to an ordinary X-ray image is obtained, for example, in such a manner that an object is one-dimensionally moved in the X-ray CT, and an X-ray image thus obtained is displayed to allow a physician or the like to determine a measuring target on the basis of the displayed X-ray image. However, conventional imaging apparatuses using nuclear magnetic resonance are not provided with such means, and therefore cannot previously determine a target to be measured in an object.

SUMMARY OF THE INVENTION

It is accordingly an object of the present invention to provide an imaging apparatus using nuclear magnetic resonance in which a measuring position in an object can be readily determined.

In order to attain the above object, according to an aspect of the present invention, there is provided an imaging apparatus using nuclear magnetic resonance, in which an image corresponding to the projection of nuclear spin distribution in an object on a two-dimensional plane is displayed in a display device, a display mark for indicating a desired measuring position is displayed on a display surface for displaying the above projection image, and at least one of magnetic field generating means for generating a static magnetic field, gradient magnetic fields and a radio frequency magnetic field is controlled on the basis of the position of the display mark on the display surface so that an image of that cross section of the object which is located at a position indicated by the display mark, can be obtained.

DESCRIPTION OF THE PREFERRED EMBODIMENTS

Figure 1:
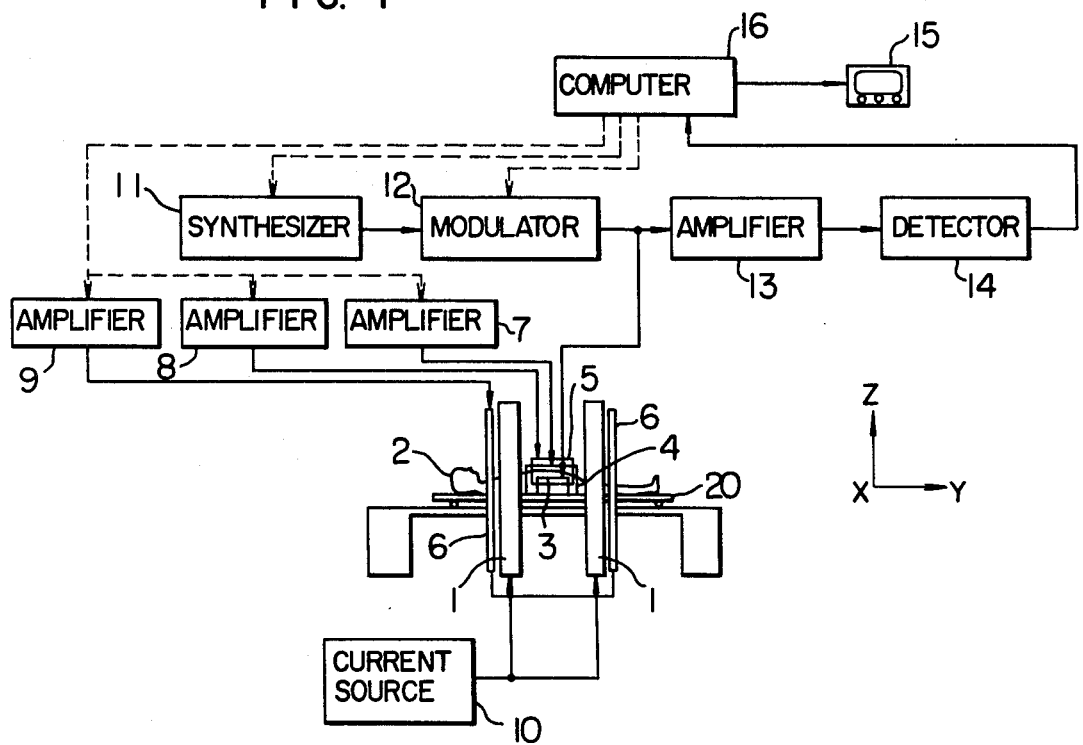
FIG. 1 is a block diagram showing the construction of an embodiment of an imaging apparatus according to the present invention together with the coordinate system.
Figure 2:
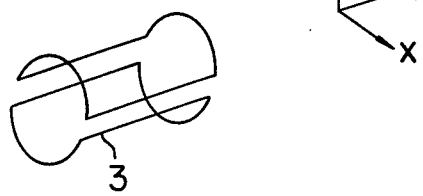
FIG. 2 shows coil means for generating an X-direction gradient field.

FIG. 1 schematically shows the construction of an embodiment of an imaging apparatus according to the present invention. In FIG. 1, reference numeral 1 designates coil means for generating a static magnetic field which is kept uniform with an accuracy of about $10^{-4}$ in a region where inspection is carried out, 2 an object to be inspected (in this case, a human body), 3 coil means for generating a radio frequency magnetic field, 4 and 5 coil means for generating gradient fields having respective gradient of field strength in the X- and Z-directions (directions being denoted by arrows at a righthand portion of FIG. 1, where X-direction being upwardly perpendicular to the plane of the sheet). The field strength of each gradient field preferably varies substantially linearly with the distance in the specified direction. FIG. 2 shows a structure of the coil means 4 for generating a magnetic field whose strength varies in the X-direction. In FIG. 2, arrows indicate the direction of coil current. The coil means 5 for generating a magnetic field whose strength varies in the Z-direction is obtained by rotating the coil means 4 shown in FIG. 2 about the Y-axis through 90°. Further, in FIG. 1, reference numeral 6 designates coil means including a pair of one-turn coils connected in a manner that a current flows through the one-turn coils in opposite directions, for generating a magnetic field whose strength varies in the Y-direction to establish a gradient of field strength in the Y-direction, 7, 8 and 9 coil drivers (that is, amplifiers) for supplying currents to the coil means 4, 5 and 6, and 10 a constant current source for supplying a constant current to the coil means 1 for generating a static magnetic field.

Figure 3:
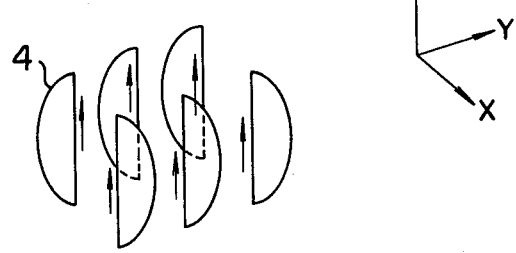
FIG. 3 shows coil means for generating a radio frequency magnetic field.

The coil means 3 for generating a radio frequency magnetic field is used not only for generating the radio frequency magnetic field but also for detecting a nuclear magnetic resonance signal, and may be a saddle-shaped coil, solenoid coil, or one-turn coil. FIG. 3 shows an example of the coil means 3.

The coil drivers 7, 8 and 9 are controlled by a computer 16. The timing of applying the gradient field and the waveform of a coil current for generating the gradient field are previously determined. On the other hand, a radio frequency magnetic field for exciting magnetic spins is generated in such a manner that a radio frequency wave generated by a synthesizer 11 is shaped and power-amplified by a modulator 12, and then supplied to the coil means 3 as a coil current. The synthesizer 11 and modulator 12 are controlled by the computer 16, and moreover the frequency of the radio frequency wave, the timing of applying the radio frequency magnetic field and the pulse width of a pulsive radio frequency coil current are previously determined. The above-mentioned gradient field and radio frequency magnetic field are applied to the object 2 which is inserted in the coil means 1 for generating a static magnetic field $H_o$. A signal from the object 2 is received by the coil means 3, amplified by an amplifier 13, and then subjected to quadrature detection in a detector 14 to be applied to the computer 16. The computer 16 processes the received signal to display on a cathode ray tube display 15 an image corresponding to a nuclear spin distribution or a relaxation time distribution of nuclear spins. The respective coil means are shown separately for illustrative purpose, but they may be practically wound on a same bobbin which accomodates the object.

Figure 4:
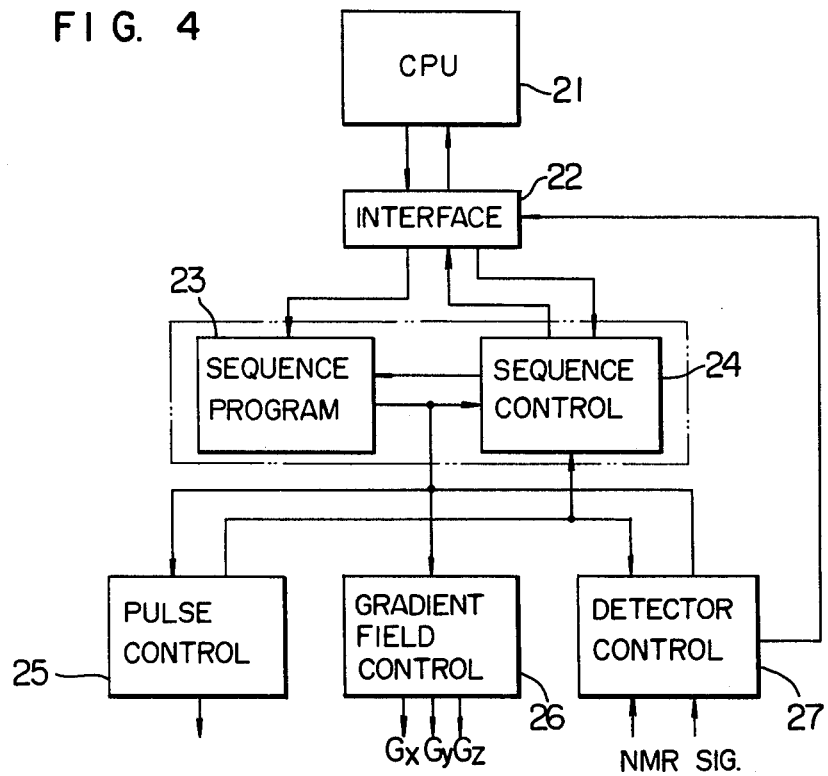
FIG. 4 is a diagram for explaining the operation of the computer shown in FIG. 1.
Figure 5:
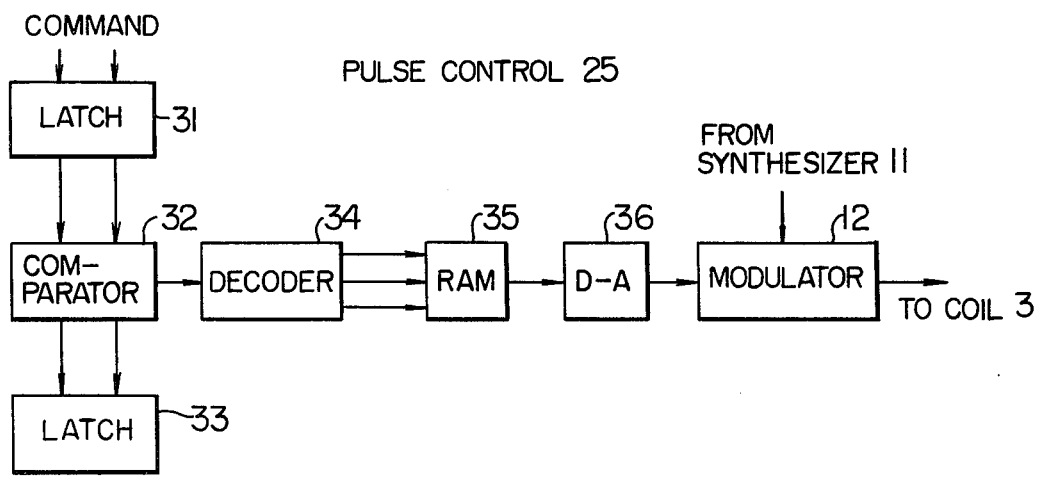
FIG. 5 is a block diagram showing a circuit configuration of the pulse controller shown in FIG. 4.

Next, the operation of the computer 16 will be explained. As shown in FIG. 4, the computer 16 is made up of a central processing unit 21, an interface 22, a sequence programmer 23, a sequence controller 24, a pulse controller 25, a gradient field controller 26 and a detector control unit 2. The interface 22 decodes instructions from the central processing unit 21, and then instructs a sequence control part to receive the instructions. The sequence control part includes the sequence programmer 23 for storing the instructions from the central processing unit 21 and the sequence controller 24. The programmer 23 is formed of, for example, a random access memory capable of containing 256 words each having 32 bits. One instruction includes 32 bits, the upper 8 bits of which indicate the kind of the instruction and the lower 24 bits indicate a condition specified by the instruction. The sequence controller 24 is operated by, for example, a clock signal of 10 MHz, and successively reads out the contents of the sequence programmer 23 at addresses 0, 1, 2,. . . and so on to execute the instructions. FIG. 5 shows an example of the circuit configuration of the pulse controller 25. Referring to FIG. 5, an instruction from the sequence control part is latched by a latch circuit 31 to be compared, by a comparator 32, with a signal previously stored in a latch circuit 33. Thus, it is judged whether the instruction from the sequence control part is an instruction for the pulse controller 25 or not. When the instruction latched by the latch circuit 31 agrees with the signal latched by the latch circuit 33, the instruction is transferred to a decoder 34, to determine read-out addresses in a random access memory 35, on the basis of the contents of the instruction, and to deliver a trigger pulse for indicating the start of a read-out operation. The output of the random access memory 35 is converted by a D-A converter 36 into an analog signal. The analog signal is applied to the modulator 12 to modulate a radio frequency signal from the synthesizer 11.

Similarly, the contents of a random access memory included in the gradient field controller 26 are read out on the basis of an instruction from the sequence control part, and then converted into an analog signal. The analog signal thus obtained is applied to a coil driver which drives the coil means for generating the gradient field.

As mentioned above, respective waveforms of coil currents for generating the radio frequency magnetic field and gradient field have been previously stored in the random access memories included in the pulse controller 25 and gradient field controller 26, and the contents of each of the random access memories are read out on the basis of an instruction from the sequence control part to obtain a coil current having a desired waveform. The frequency of the radio frequency magnetic field is selected by appropriately changing the frequency of the output of the synthesizer 11 under the control of the computer 16. If necessary, the frequency of the radio frequency magnetic field may be changed in such a manner that a control signal for selecting the frequency of the output of the synthesizer 11 is stored in a random access memory and the frequency of the output of the synthesizer is changed in accordance with the control signal.

In the detector control unit 27, an analog signal which is detected by the coil means 3 on the basis of an instruction from the sequence control part, is converted into a digital signal at a predetermined sampling period, and the digital signals thus obtained are summed up simultaneously with the sampling operation. The results of summation performed in the detector control unit 27 are applied to the central processing unit through the interface 22, to be Fourier-transformed and then subjected to the processing for forming an image.

According to the present embodiment, prior to a main inspection for displaying an image of the cross section of a desired measuring target in an object, an image corresponding to the projection of a nuclear spin distribution in the object on a two-dimensional plane is obtained by the same apparatus as used in the main inspection and displayed on the cathode ray tube, to enable a physician or the like to determine the desired measuring target on the basis of the above projection image.

Now, an inspecting procedure for a human body will be explained. Let us assume that the human body 2 lies on a bed 20.

Referring to FIG. 1, let us consider the case where an image indicating the projection of a nuclear spin distribution in the human body 2 on the X-Y plane is utilized to determine a measuring cross section of the human body 2 parallel to the X-Z plane and to obtain an image of a nuclear spin distribution or relaxation time distribution of nuclear spins in the cross section, by way of example.

There are several possible ways for obtaining the above-mentioned image indicating the projection of a distribution on the X-Y plane. Of these possibilities, an improved version of the echo-planar method proposed by P. Mansfield (Journal of Magnetic Resonance, Vol. 29, 1978, pp 353 to 373) will be explained below.

Figure 6:
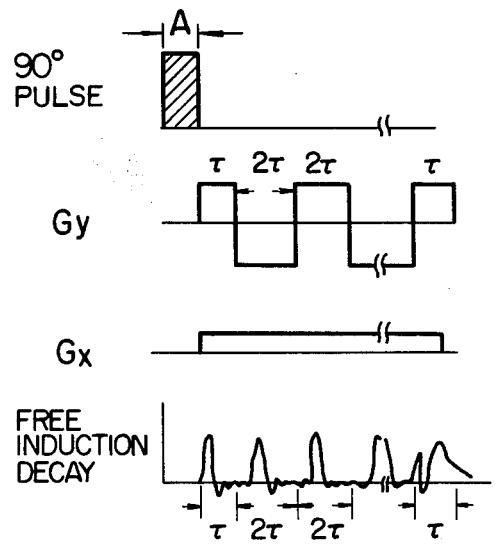
FIG. 6 is a diagram showing waveforms of a radio frequency magnetic field and gradient fields for obtaining a projection image.

FIG. 6 shows a measuring sequence in the improved version. Referring to FIG. 6, a 90° pulse from the coil means 3 for generating a radio frequency magnetic field is applied to the whole of the human body 2 which is an object to be inspected.

Immediately after the application of the 90° pulse, the observation of a free induction decay signal is started. Incidentally, nuclear spins within a body placed in a static magnetic field are parallel to the static field, on the whole. A pulsive radio frequency magnetic field for rotating the above nuclear spins through 90° is called a 90° pulse. A width A of the 90° pulse must be sufficiently narrow to rotate nuclear spins in the whole of the field of view through 90°. Symbols $G_y$ and $G_x$ in FIG. 6 designate magnitudes of gradients of the field strength in the Y- and X-directions, and the gradients $G_y$ and $G_x$ are given by the coil means 6 and 4, respectively. The value of $G_y$ is positive during a first period $\tau$ following the 90° pulse, and then becomes negative or positive alternately at intervals of $2\tau$ ending with a positive pulse of duration $\tau$. The value of $G_x$ is kept constant during an observation period. As mentioned previously, the waveforms of coil currents for genrating the radio frequency magnetic field and the gradient field (in respective directions) have been previously stored in the random access memories included in the pulse controller 25 and gradient field controller 26. Respective contents of these random access memories are read out under the control of the computer to drive the synthesizer 11, modulator 12, and coil drivers 7 and 9, and thus desired magnetic field with specific gradient can be generated.

A signal detected by the coil means 3 is led to the detector 14 through the amplifier 13 to be subjected to quadrature detection, and then applied to the computer 16 to be Fourier-transformed and subjected to the processing for forming an image.

An image indicating the projection of a density distribution of nuclear spins on the X-Y plane can be reconstructed from the envelope of functions which are obtained by Fourier-transforming the free induction decay signals detected in accordance with the above-mentioned sequence. In the echo-planar technique, when the length of the field of view in the direction of the X-axis is expressed by $l_x$, it is required to satisfy the following relation:

$$l_x G_x = G_y.$$

The above-mentioned method used in the present embodiment is different from the method described in the previously-mentioned publication in that a sequence for selecting a specified slice plane perpendicular to the Z-direction shown in FIG. 1 is omitted in the method used in the present invention. This enables one to obtain a projection image. The image indicating the projection of a nuclear spin distribution on the X-Y plane has the following advantages in determining the position of a cross section to be measured. That is, a two-dimensional image obtained by the method used in the present embodiment corresponds to the projection of a three-dimensional nuclear spin distribution on the X-Y plane, and therefore a point on the image indicates the sum of nuclear spin signals in the Z-direction. Accordingly, the image has an extremely high signal-to-noise ratio. Further, in the case where an image of a specified cross section perpendicular to the Z-axis is used in place of the above image, the shape of those organs in human body which are distributed in the Z-direction, varies greatly with the value of the Z-coordinate of the specified cross section. Therefore, the image of the specified cross section is unsuitable for determining a cross section to be measured in the main inspection. The image obtained by the method used in the present embodiment includes integrated values in the Z-direction, and therefore can eliminate such a problem, i.e. can be used advantageously as compared with the image of a specified cross section perpendicular to the Z-direction.

Next, explanation will be made on determination of a to-be-measured cross section using the above-mentioned projection image, with reference to FIG. 7.

Figure 7:
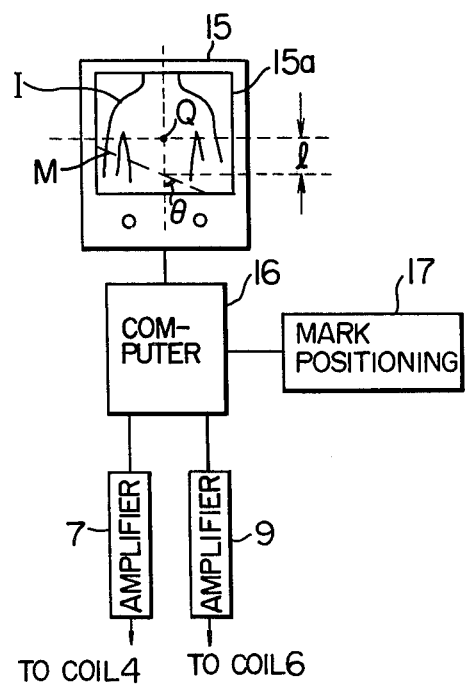
FIG. 7 is a block diagram showing a control system in the embodiment.

FIG. 7 is a block diagram showing a control system in the present embodiment. In FIG. 7, reference numeral 15 designates a display device such as a cathode ray tube display, and 15a a display surface on which an image corresponding to a nuclear spin distribution or a relaxation time distribution of nuclear spins is displayed. As shown in FIG. 7, on the display face 15a are displayed an image I corresponding to the projection of a nuclear spin distribution on the X-Y plane and a linear display mark (namely, a cursor) M which is indicated by a broken line. The display mark M can be freely moved on the display face 15a by an external operation, to be set at a desired position on the display face, and the mark M indicates the position of a to-be-measured cross section perpendicular to the X-Y plane. A mark positioning unit 17 provided, for example, in a console is employed to set the display mark M at a desired position on the display face 15a. The mark operating part of the mark positioning unit 17 includes, for example, two variable resistors. The displacement of the display mark M in the Y-direction (that is, in the downward direction in FIG. 7) at the display face 15a, that is, a distance L of the mark M from the center Q of the field of view on Y-axis can be freely set by a first one of the variable resistors, and an angle $\theta$ between the display mark M and the Y-axis can be freely set by a second variable resistor. Since the construction of a computer 16 has been explained in detail in connection with FIG. 4, explanation will be made on only the operation of the computer for determining a cross section to be measured. A mark positioning signal from the mark positioning unit 17 is applied to the central processing unit 21 through the interface 22 to be converted into a mark display signal for displaying a linear display mark. The mark display signal is combined with a signal for displaying the previously-mentioned projection image. The composite signal thus formed is supplied to the display device 15 through the interface 22 to display the projection image I and the display mark M on the display face 15a. Further, in the central processing unit 21, an actual length L corresponding to the length L of the mark M from the center Q of the field of view and the angle $\theta$ between the mark M and the Y-axis are calculated on the basis of the mark positioning signal. It will be apparent that the mark M may be a calibrated rule.

In an imaging apparatus using nuclear magnetic resonance, the direction of a cross section to be measured can be freely selected by adjusting the gradient of field strength, e.g. in each of a pair of gradient fields which are orthogonal in direction of gradient of field strength to each other. When the gradients of field strength in the X- and Y-directions in the apparatus shown in FIG. 7 are expressed by $G_x$ and $G_y$, respectively, a gradient G of field strength obtained by simultaneously applying the gradient fields having the gradients $G_x$ and $G_y$ is given by the following equation:

$$\overline{G} = G_x \overline{i} + G_y \overline{j},$$

where $\overline{G}$ is a vector indicating the gradient G of field strength, $\overline{i}$ a unit vector in the X-direction, and $\overline{j}$ a unit vector in the Y-direction. Accordingly, a cross section making an angle $\theta$ with the Y-axis can be obtained by selecting the gradients $G_x$ and $G_y$ so that an equation $\tan^{-1}(G_x/G_y) = \theta$ is satisfied. Such selection of the gradients $G_x$ and $G_y$ can be made, for example, in the following manner. That is, the ratio $G_x/G_y$ is calculated using the above equation and the angle $\theta$ obtained by the computer 16. Then, currents for generating gradient fields corresponding to the ratio $G_x/G_y$ are produced in the gradient field controller 26, to be supplied to the coil driver 7 for generating the gradient field whose field strength varies in the X-direction and the coil driver 9 for generating the gradient field whose field strength varies in the Y-direction. Alternatively, currents having a predetermined magnitude are generated by the gradient field controller 26, and the gain of the coil drivers 7 and 9 supplied with the currents may be controlled in accordance with the calculated ratio $G_x/G_y$.

Further, a cross section corresponding to a straight line on the display face 15a which is spaced apart from the center Q of the field of view by a length L in the Y-direction, can be measured in the following manner. That is, the gradient fields, the radio frequency magnetic field and a receiver are adjusted so that the image of a cross section intersecting the center of the field of view can be obtained by an imaging system, and then the bed 20 shown in FIG. 1 is moved by an actual distance L corresponding to the above-mentioned distance L so that the desired cross section indicated by the cursor (namely, the display mark) M intersects the center Q of the field of view.

Figure 8:
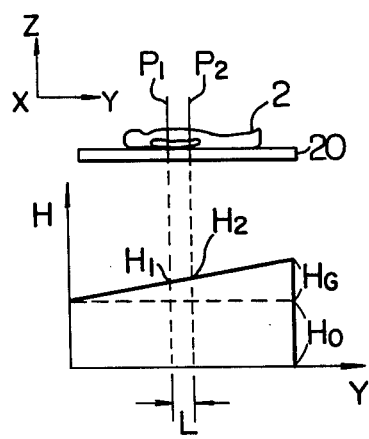
FIG. 8 is a diagram showing a method of adjusting a magnetic field.

The above-mentioned method may be replaced by the following second method. In an imaging apparatus using nuclear magnetic resonance, the position of a to-be-measured cross section is determined by the strength H of a magnetic field previously applied to an object to be inspected and the frequency of a radio frequency magnetic field applied perpendicularly to the above magnetic field. The strength H of the above magnetic field is generally expressed as follows:

$$H = H_G + H_o$$

where $H_G$ is a gradient field component, and $H_o$ a static field component which is uniform throughout the magnetic field region. Now, the second method will be explained in detail with reference to FIG. 8. In FIG. 8, reference symbol $P_1$ designates a cross section intersecting the center of the field of view, and $P_2$ a cross section which is spaced apart from the center of the field of view by a distance L (corresponding to a distance L on the display face of the display device 15) and is required to be measured. In order to measure the cross section $P_2$, when the values of the field strength H at the cross sections $P_1$ and $P_2$ are expressed by $H_1$ and $H_2$, the frequency $f_2$ of the radio frequency magnetic field is set so as to satisfy the following relation:

$$f_2 = \gamma H_2$$

where $\gamma$ is a gyromagnetic ratio. The field strength $H_2$ can be obtained from an equation $H_2 = H_1 + G_y L$, using the distance L and a gradient $G_y$ of field strength in the Y-direction.

Alternatively, in the case where the frequency of the radio frequency magnetic field is equal to $f_1 (=\gamma H_1)$, that is, the radio frequency magnetic field is adjusted so that the cross section $P_1$ intersecting the center of the field of view is measured, the frequency of the radio frequency magnetic field is not changed, but the static field $H_o$ is varied so that the field strength H at the cross section $P_2$ becomes equal to $H_1$.

In the former case, the frequency of the radio frequency magnetic field is varied by changing the frequency of the output of the synthesizer 11 under the control of the computer. In the latter case, the strength $H_o$ of the static magnetic field is varied in such a manner that a current supplied to the coil means 1 for generating the static magnetic field is varied, for example, by controlling a variable resistor in the constant current source 10.

In the above-mentioned explanation of the present embodiment, the improved version of the echoplanar method is employed to obtain the projection image. However, the present invention is not limited to such a method.

As has been explained in the foregoing, according to the present invention, an image corresponding to the projection of a nuclear spin distribution in an object on a two-dimensional plane is displayed on a display device, and means for generating a static magnetic field, gradient fields or a radio frequency magnetic field is controlled in accordance with the position of a display mark on a display face for displaying the above image. Accordingly, the present invention can provide an imaging apparatus in which the position of a to-be-measured target in an object can be readily determined.

We claim:

1. An imaging apparatus using nuclear magnetic resonance, comprising:
   a plurality of magnetic field generating means for applying a static magnetic field, a gradient field having gradients of field strength in at least two of the orthogonal three directions and a radio frequency magnetic field to an object to be inspected;
   signal detecting means for detecting a nuclear magnetic resonance signal from said object;
   means for obtaining from said nuclear magnetic resonance signal an image corresponding to the projection of said object on a two-dimensional plane;
   display means for displaying said image corresponding to said projection;
   mark positioning means for freely moving a display mark on a display face to set said display mark at a desired position on said display face, said image corresponding to said projection being displayed on said display face; and
   control means for controlling at least one of said magnetic field generating means on the basis of said display mark to obtain an image of that cross section of said object which is located at a position indicated by said display mark.

2. An imaging apparatus using nuclear magnetic resonance according to claim 1, wherein an input to said control means is an angle between a predetermined direction on said display face and said display mark, and said magnetic field generating means for applying said gradient field to said object is controlled by said control means on the basis of said input.

3. An imaging apparatus using nuclear magnetic resonance according to claim 2, wherein said magnetic field generating means for applying said gradient field to said object includes coil means for generating said linear gradient field and a coil driver for supplying a current to said coil means, and said control means controls said coil driver to control said current.

4. An imaging apparatus using nuclear magnetic resonance according to claim 1, wherein an input to said control means is a distance in a predetermined direction between a predetermined point on said display face and said display mark, and one of said magnetic field generating means for applying said static magnetic field to said object and said magnetic field generating means for applying said radio frequency magnetic field to said object is controlled by said control means on the basis of said input.

5. An imaging apparatus using nuclear magnetic resonance according to claim 4, wherein said magnetic field generating means for applying said static magnetic field to said object includes coil means for generating said static magnetic field and a constant current source for supplying a constant current to said coil means, and said control means controls said constant current source to control the magnitude of said constant current.

6. An imaging apparatus using nuclear magnetic resonance according to claim 4, wherein said magnetic field generating means for applying said radio frequency magnetic field to said object includes coil means for generating said radio frequency magnetic field, a radio frequency generator for generating a radio frequency signal, and a modulator for moudlating said radio frequency signal to supply a modulated signal to said coil means, and wherein said control means controls said radio frequency source to control the frequency of said radio frequency signal.

7. An imaging apparatus using nuclear magnetic resonance (NMR) comprising:
  means for generating a magnetic field having gradients of field strength at least in two of orthogonal three directions;
  means for exciting NMR in an object placed in said magnetic field and for detecting NMR signal;
  means for controlling said field generating means to generate a magnetic field having gradients of field strength in two directions and no gradient in another direction orthogonal to said two directions;
  display means for displaying an NMR image based on detected NMR signal with a measure for identifying a position; and
  means for controlling the field generating means based on the position of said measure in the display means.

8. A method of controlling an imaging device using nuclear magnetic resonance (NMR) which includes first means for applying a static field, second means for applying a gradient magnetic field having gradients of field strength, third means for applying a rotating magnetic field and for detecting NMR signal, and means for displaying an image, comprising the steps of:
  applying magnetic field having gradients of field strength in orthogonal two directions with said first and second means, the field strength in a remaining direction orthogonal to said two orthogonal directions having no gradient;
  detecting NMR signal from an object in said magnetic field by said third means, the NMR signal representing nuclear magnetic spins integrated in said remaining direction; and
  displaying a projection image of the object projected along said remaining direction in said display means based on said NMR signal with a measure for identifying a position in the object.

* * * * *